US007671441B2

(12) United States Patent
Henson

(10) Patent No.: US 7,671,441 B2
(45) Date of Patent: Mar. 2, 2010

(54) TRENCH MOSFET WITH SIDEWALL SPACER GATES

(75) Inventor: Timothy Henson, Torrance, CA (US)

(73) Assignee: International Rectifier Corporation, El Segundo, CA (US)

(*) Notice: Subject to any disclaimer, the term of this patent is extended or adjusted under 35 U.S.C. 154(b) by 20 days.

(21) Appl. No.: 11/396,759

(22) Filed: Apr. 3, 2006

(65) Prior Publication Data

US 2006/0223260 A1 Oct. 5, 2006

Related U.S. Application Data

(60) Provisional application No. 60/668,724, filed on Apr. 5, 2005.

(51) Int. Cl.
H01L 21/20 (2006.01)

(52) U.S. Cl. .................. 257/500; 257/151; 257/153; 257/E21.54; 257/E21.55; 257/118; 257/333; 257/466; 257/513; 257/594; 438/224; 438/221

(58) Field of Classification Search .......... 257/500, 257/151, E21.54, E21.55, 153, 118, 244, 257/513, 594; 438/243, 391
See application file for complete search history.

(56) References Cited

U.S. PATENT DOCUMENTS 5,825,069 A * 10/1998 Wen et al. ............... 257/390
6,172,391 B1 * 1/2001 Goebel et al. ............ 257/305
6,573,560 B2 * 6/2003 Shenoy .................... 257/330
6,621,107 B2 * 9/2003 Blanchard et al. ........ 257/155
6,710,402 B2 * 3/2004 Harada ..................... 257/330
7,045,858 B2 * 5/2006 Matsuda et al. .......... 257/330
7,291,884 B2 * 11/2007 Darwish et al. .......... 257/330
2001/0001494 A1 * 5/2001 Kocon ...................... 257/328

* cited by examiner

Primary Examiner—Wael Fahmy
Assistant Examiner—Marc Armand
(74) Attorney, Agent, or Firm—Farjami & Farjami LLP

(57) ABSTRACT

A semiconductor power device includes a semiconductor body with a plurality of gate trenches formed therein. Disposed within each gate trench is a spacer gate that extends along at least a portion of the sidewalls of the gate trench but not along at least a portion of the bottom surface of the trench. The spacer gate of each gate trench may also include a layer of silicide along outer surfaces thereof. The semiconductor body may include a channel region and each gate trench may extend through the channel region and into the semiconductor body. Formed at the bottom of each gate trench within the semiconductor body may be a tip implant of the same conductivity as the semiconductor body. In addition, a deep body implant of the same conductivity as the channel region may be formed at the base of the channel region.

5 Claims, 2 Drawing Sheets

TRENCH MOSFET WITH SIDEWALL SPACER GATES

RELATED APPLICATION

This application is based on and claims benefit of U.S. Provisional Application No. 60/668,724, filed on Apr. 5, 2005, entitled "TRENCH MOSFET WITH POLYSILICON SIDEWALLS IN TRENCH AND SILICIDE SURFACES ON SIDEWALLS," by Timothy D. Henson to which a claim of priority is hereby made and the disclosure of which is incorporated by reference.

BACKGROUND OF THE INVENTION

1. Field of the Invention

The present invention relates generally to semiconductor devices, and more specifically, to trench type power semiconductor devices with sidewall spacer gates and a method for fabricating the same.

2. Description of the Prior Art

Trench type power semiconductor devices such as power MOSFETs are well known. For example, referring to FIG. 1 there is shown a portion of a power MOSFET 100 according to the prior art. MOSFET 100 includes a semiconductor body 14 having an epitaxially grown silicon layer 16 (sometimes referred to as an epitaxial layer or as the drain epi region) of one conductivity (e.g. N-type) formed over a silicon substrate 18 of the same conductivity, but of higher concentration of impurities. A channel region 20 (sometimes referred to as the body region) is formed in drain epi region 16 and extends from the top surface of the semiconductor body to a first depth. Channel region 20 has a conductivity opposite to that of drain epi region 16 (e.g. P-type). Formed within channel region 20 are source regions 22, which have the same conductivity (e.g. N-type) as drain epi region 16.

MOSFET 100 also includes a plurality of gate trenches, such as gate trench 12, formed in semiconductor body 14. A gate insulation layer 24 typically lines the sidewalls and bottom surface of the gate trenches. This insulation layer may be formed with silicon dioxide or the like. A conductive gate electrode 26 is disposed within each gate trench 12. Each gate electrode 26 is typically formed as a thick conductive polysilicon gate mass that fills the gate trench.

MOSFET 100 further includes a source electrode 28, which is electrically connected to source regions 22, and may also include high conductivity contact regions 30 formed in channel region 20. High conductivity contact regions 30 are highly doped with dopants of the same conductivity as channel region 20 (e.g. P-type) in order to reduce the contact resistance between source electrode 28 and channel region 20. Power MOSFET 100 further includes a drain electrode 32 in electrical contact with silicon substrate 18.

In power semiconductor devices like MOSFET 100, the gate trenches 12 typically extend at least through the entire thickness of channel region 20, and in particular, often extend into drain epi region 16. Similarly, the gate electrodes 26 typically overlap at least a portion of source regions 22, and extend through channel region 20 and often into drain epi region 16. With this configuration, the gate electrodes 26 fully overlap channel region 20 and allow for the formation of an accumulation region through the channel region so that current will flow between source electrode 28 and drain electrode 32.

In general, the configuration of gate trenches 12 and gate electrodes 26 in power semiconductor devices like MOSFET 100 create several issues. For example, as is known, the overlap of drain epi region 16 and gate electrodes 26 determines the gate-drain charge ($Q_{gd}$) of the device, which can affect the switching frequency of the device. In general, it is desirable to reduce this overlap and to keep the gate-drain charge as small as possible. Nonetheless, it can be difficult to reduce this overlap/gate-drain charge. For example, one technique used to reduce the overlap is to use thin gate trenches 12, thereby reducing the size of the gate electrodes 26. However, the cleaning of thin gate trenches during device fabrication can be difficult, leading to trench defects.

Another technique used to reduce the gate-drain charge is to increase the thickness of gate insulation layer 24 along the bottom surface of the gate trenches 12. However, while it is desirable to make this region of gate insulation layer 24 thick, it is also desirable to keep the gate insulation layer 24 thin along the sidewalls of the gate trenches so as to keep the device threshold voltage ($V_{th}$) low. Unfortunately, the fabrication of a gate insulation layer 24 with varying thicknesses is often a complicated process sequence.

As is also known, it is desirable to keep the size of gate electrodes 26 in power semiconductor devices like MOSFET 100 small to reduce the gate charge ($Q_g$) of the electrodes and thereby improve the efficiency of the device. One technique used to form small gate electrodes is to use thin gate trenches 12, as described above. However, as also described above, the use of thin trenches can lead to trench defects. Another technique used to reduce the size of the gate electrodes is to recess the electrodes into the gate trenches, as shown by MOSFET 100. As an example, gate electrodes 26 of a semiconductor device like MOSFET 100 may be formed by depositing a thick layer of polysilicon that fills trenches 12 and then etching the polysilicon back. As discussed above, it is desirable to have the gate electrodes overlap source regions 22. In general, it can be difficult to control the polysilicon recess depth to obtain this overlap when etching back a thick polysilicon gate mass.

Another problem with thick polysilicon gates 26 is that voids may form in the polysilicon as the polysilicon is deposited into the trenches 12. Such voids can trap charge that cause instabilities in the threshold voltage ($V_t$) and drain-to-source leakage current ($I_{dss}$) of the device.

A further problem with gate trenches 12 and gate electrodes 26 is that it is desirable to have the gate trenches and thereby the gate electrodes extend into drain epi region 16 to ensure the gate electrodes overlap channel region 20, as discussed above. However, it can be difficult to control the trench etch depth to obtain sufficient overlap while not over etching the trenches. Again, over etching the trenches results in larger gate electrodes and thereby increased gate-drain charge and increased gate charge.

SUMMARY OF THE INVENTION

Accordingly, it would be desirable to produce a trench type power semiconductor device that overcomes the above and other disadvantages of the prior art. According to an embodiment of the invention, a power semiconductor device, such as a MOSFET, includes, for example, a silicon body having a channel region of a first conductivity type formed atop a drain epi region of a second conductivity type. Formed within the semiconductor body are a plurality of gate trenches that extend through the channel region and into the drain epi region. A gate insulation layer lines the sidewalls and bottom surface of each gate trench.

Disposed within each gate trench over the gate insulation layer is a gate electrode. According to an embodiment of the invention, each gate electrode is formed as a sidewall spacer gate that extends along at least a portion of the sidewalls of the gate trench but not along at least a portion of the bottom surface of the trench. Accordingly, a void is formed through the center of each spacer gate, which extends from the upper end of a gate trench through to the bottom surface of the trench.

A gate insulation body is disposed within the void of each gate trench and covers the outer surfaces of the spacer gate therein. According to an embodiment of the invention, a silicide layer may also cover the full outer surfaces of the spacer gate to substantially reduce the gate resistance ($R_g$) of the gate.

The spacer gates of the present invention may be formed by depositing a thin layer of doped polysilicon in each gate trench and then etching the polysilicon until the bottom surface of each gate trench is exposed.

Advantageously, the spacer gates of the present invention have several benefits as compared to semiconductor devices of the prior art. For example, because the spacer gates do not extend along a portion of the bottom surfaces of the gate trenches, there is minimal overlap between the drain epi region and the gate electrodes, thereby reducing the gate-drain charge ($Q_{gd}$) of the device. In addition, because the spacer gates are formed as a thin layer of polysilicon rather than as a thick polysilicon gate mass, the gates have a reduced size thereby reducing the gate charge ($Q_g$) of the electrodes and thereby improving the efficiency of the device. In addition, the thin layer of polysilicon is easier to deposit as compared to the thick polysilicon gate mass, resulting in fewer problems with voids forming in the polysilicon that can trap charge and cause instabilities in the threshold voltage ($V_t$) and drain-to-source leakage current ($I_{dss}$) of the device.

According to another embodiment of the invention, the spacer gates of the present invention may allow the trench width and/or trench depth of the gate trenches to be increased (as compared to prior art semiconductor devices) without sacrificing device performance. Specifically, because the spacer gates are formed of a thin layer of polysilicon along the gate trench sidewalls, the width and/or depth of the gate trenches may be increased without increasing the size of the gate electrodes and thereby without increasing the gate charge and gate-drain charge of the device.

According to another embodiment of the invention, a power semiconductor device is as described above but further includes a trench tip implant formed in the drain epi region at the bottom of each gate trench. The trench tip implants have the same conductivity as the drain epi region and serve to control the gate to drain overlap independent of the depth of the gate trenches, thereby allowing the gate trenches to be made shallower with respect to the depth of the channel region. Notably, the trench tip implant at the bottom of each trench may be formed by using the spacer gate therein as a mask. As a result, the trench tip implant is aligned to the spacer gate. According to a further embodiment of the invention, the device may also include a deep body implant formed in the channel region along the junction with the drain epi region. The deep body implant has the same conductivity as the channel region and serves to reduce the intensity of the electric fields at the bottom of the gate trenches and along the junction of the channel and drain epi regions, thereby improving the breakdown voltage of the device.

Other features and advantages of the present invention will become apparent from the following description of the invention which refers to the accompanying drawings.

DETAILED DESCRIPTION OF THE PREFERRED EMBODIMENTS

Figure 1:
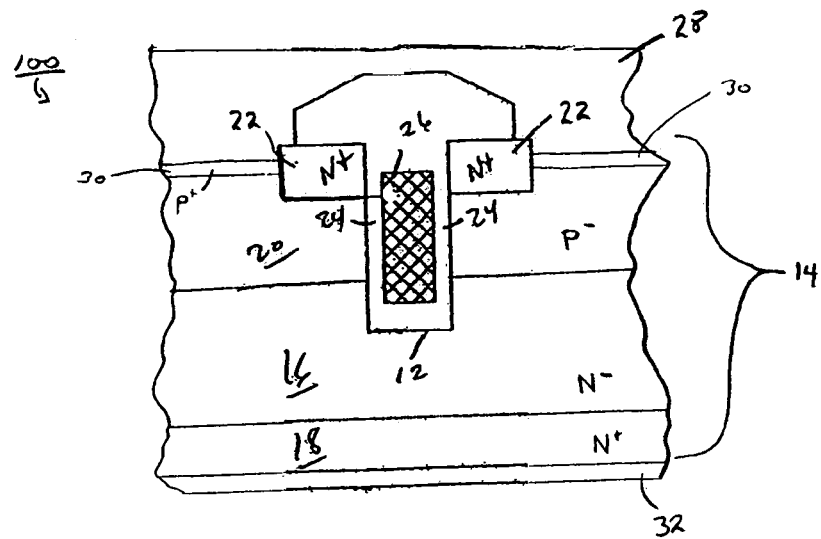
FIG. 1 shows a cross-sectional side view of a portion of a trench type power semiconductor device according to the prior art.
Figure 2:
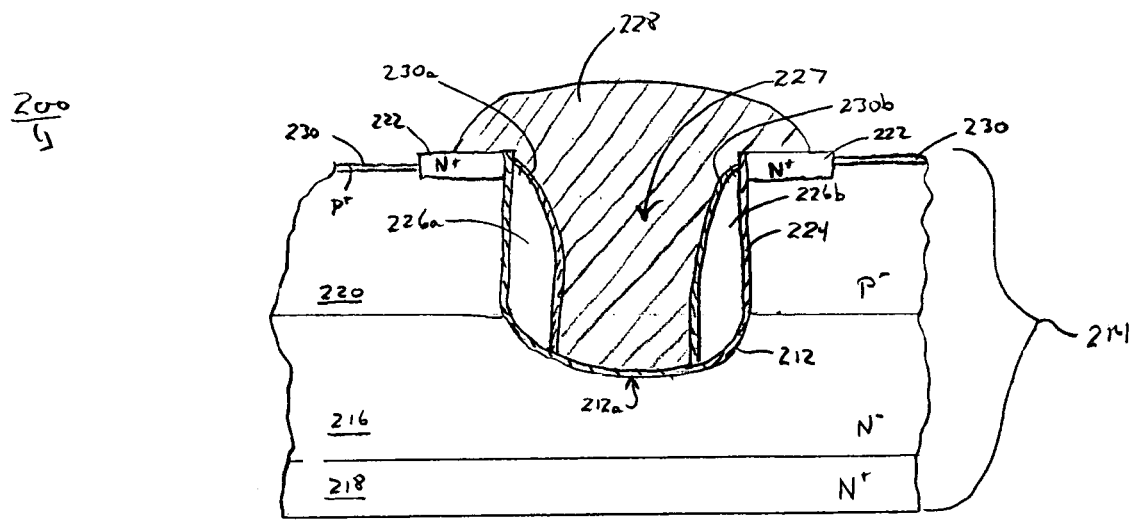
FIG. 2 shows a cross-sectional side view of a portion of a trench type power semiconductor device according to an embodiment of the invention.

Referring to FIG. 2 there is shown a cross-sectional side view of a portion of an active region of a power semiconductor device 200, such as a MOSFET, according to an embodiment of the invention. Device 200 includes a semiconductor body 214 that may be made of silicon or silicon carbide, for example. The exact configuration of body 214 is not specific to the invention. As an example, body 214 may include a drain epi region 216 of one conductivity (e.g. N-type) formed over a silicon substrate 218 of the same conductivity, but of higher concentration of impurities. A channel/body region 220 may be formed in drain epi region 216 that extends from the top surface of the semiconductor body to a first depth. Channel region 220 has a conductivity opposite to that of drain epi region 216 (e.g. P-type). Formed within channel region 220 are source regions 222, which have the same conductivity (e.g. N-type) as drain epi region 216. Device 200 may further include high conductivity contact regions 230 of the same conductivity as channel region 220. The exact configuration of the source regions and high conductivity contact regions is not specific to the invention. Although not shown in FIG. 2, device 200 further includes a source electrode and a drain electrode along the top and bottom surfaces of the device, for example. Again, the exact configuration of the source and drain electrodes is not specific to the invention. One skilled in the art will recognize that while device 200 is shown as an N-type trench power MOSFET, device 200 may also be a P-type trench MOSFET, for example.

According to an embodiment of the invention, device 200 also includes a plurality of gate trenches, such as gate trench 212, formed in the top surface of body 214 and extending through channel region 220 and into drain epi region 216. The gate trenches 212 may be configured as a plurality of parallel trenches in a stripe design. Alternatively, the trenches may be configured in a cellular design. Assuming a stripe design, each gate trench may have a depth of about 0.5 um to about 2.0 um and a width of about 0.4 um to about 1.0 um.

A gate insulation layer 224 lines the sidewalls and bottom surface of each gate trench 212. The gate insulation layer may be formed of silicon dioxide or the like. The gate insulation layer may have a uniform thickness along the sidewalls and bottom surface of each gate trench. As an example, the insulation layer may have a thickness of about 200 Å to about 1500 Å.

Disposed within each gate trench 212 over gate insulation layer 224 is a gate electrode 226 formed of N doped polysilicon, for example. According to an embodiment of the invention, each gate electrode 226 within a gate trench 212 is formed as a sidewall spacer gate, such as spacer gates 226a and 226b, that are disposed along the sidewalls of the gate trench. As an example, when the gate trenches are configured in a stripe design, spacer gate 226 may be disposed along opposing sidewalls of the trench, as shown in FIG. 2. Similarly, when the gate trenches are configured in a cellular design, the spacer gate may be disposed along each of the sidewalls of the trench.

According to an embodiment of the invention, the spacer gate of each gate trench 212 extends along at least a portion of the sidewalls of the trench but not along at least a portion 212a of the bottom surface of the trench. For example, each spacer gate 226a and 226b extends from a point along the upper end of gate trench 212 (e.g., at a point that overlaps source region 222) downward through channel region 220 and into drain epi region 216. In this way, spacer gate 226 fully overlaps channel region 220 and allows for the formation of an accumulation region through the channel region so that current will flow between the source and drain electrodes of the device. However, contrary to prior gate electrodes, spacer gate 226 does not extend along at least a portion 212a of the bottom surface of trench 212. In this way, a void 227 is formed through the center of the spacer gate, which void extends from the upper end of trench 212 to gate insulation layer 224 at the bottom surface of the trench. As an example, each spacer gate 226a and 226b within a given gate trench may have a maximum thickness of about 100 Å to about 1000 Å.

A gate insulation body 228 is disposed within void 227 of each gate trench 212 and covers the outer surfaces of spacer gate 226. Gate insulation body 228 is formed of an inter-level dielectric (ILD) material, such an oxide or the like, and extends from the bottom surface 212a of the gate trench towards the upper end of the trench and possibly above the upper end of the trench, as shown in FIG. 2.

According to an embodiment of the invention, a silicide layer, such as silicide layers 230a and 230b, covers the full outer surfaces of the spacer gate within each trench to substantially reduce the gate resistance ($R_g$) of the gate. As an example, silicide layer 230a and silicide layer 230b may have a thickness of about 1 Å to about the thickness of each spacer gate 226a or 226b (e.g., 1000 Å). If spacer gate 226 extends substantially the full depth of a gate trench, silicide layers 230a/230b will have a length approximately equal to the trench depth.

Reference will now be made to a process for fabricating trench type power MOSFET 200 according to an embodiment of the invention. Assuming the presence of an initial silicon body 214, a plurality of gate trenches 212 are first etched in the surface of body 214 using any technique known in the art. Next, a gate oxide layer is formed over the sidewalls and bottom surface of each gate trench 212, thereby forming gate insulation layer 224. Next, a thin layer of polysilicon is deposited into each gate trench 212. Once depositing and diffusing a dopant to make the polysilicon N type and conductive, the polysilicon is etched using a dry etch until the bottom surface 212a of each gate trench is exposed, thereby forming a spacer gate, such as gates 226a and 226b, in each trench. Next, the exposed outer surfaces of each spacer gate are silicided, thereby forming a silicide layer, such as silicide layers 230a and 230b. Finally, insulation body 228 is disposed within void 227 of each gate trench 212. One skilled in the art will recognize that the above fabrication process will also include, among other possible steps, the formation of the source regions and possibly the high conductivity contact regions, and source and drain electrodes.

Advantageously, the spacer gates 226 of the present invention have several benefits as compared to the gate electrodes of prior semiconductor devices, such as MOSFET 100. For example, because the spacer gates do not extend along a portion of the bottom surface 212a of trench gates 212, there is minimal overlap of drain epi region 216 and the gate electrodes 226, thereby reducing the gate-drain charge ($Q_{gd}$) of the device. Notably, the reduction in the gate-drain charge is also obtained without having to use a thick trench bottom oxide, which may entail a complicated process sequence.

In addition, because the gate electrodes are formed as thin spacer gates rather than as a thick polysilicon gate mass, the gates have a reduced size, thereby reducing the gate charge ($Q_g$) of the gates and thereby improving the efficiency of the device. In addition, because a thin layer of polysilicon is used to form spacers gates 226, the polysilicon is easier to deposit, resulting in fewer problems with voids forming in the polysilicon that can trap charge and cause instabilities in the threshold voltage ($V_t$) and drain-to-source leakage current ($I_{dss}$) of the device. Furthermore, by using a thin layer of polysilicon to form spacers gates 226, it is easier to control the polysilicon recess depth when etching back the polysilicon so that the gates are recessed within the gate trenches to overlap the source regions. Furthermore, by being able to silicide along the large outer surfaces of each spacer gate, the gate resistance of the gate electrodes is substantially reduced.

Figure 3:
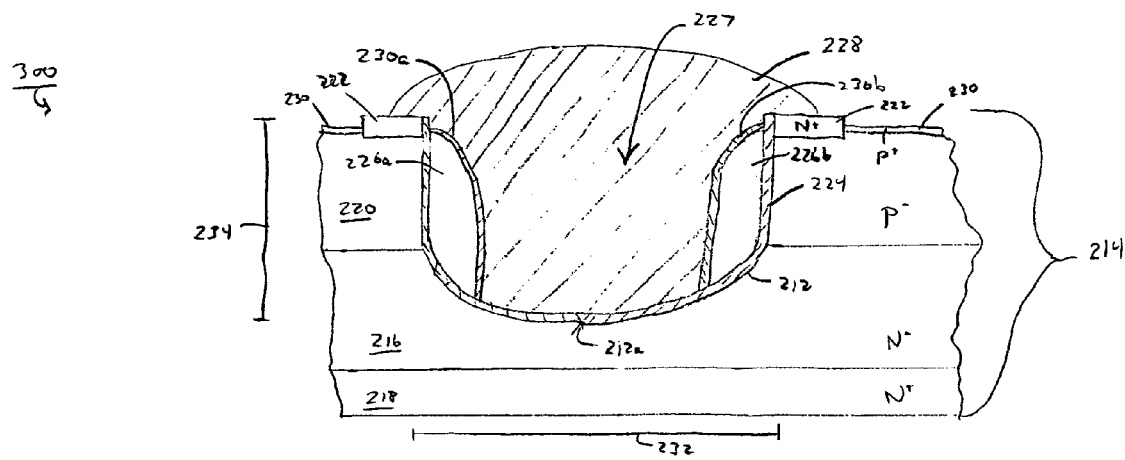
FIG. 3 shows a cross-sectional side view of a portion of a semiconductor device according to another embodiment of the invention, the device of FIG. 3 having an increased trench width and/or increased trench depth as compared to the device of FIG. 2.

Referring now to FIG. 3 there is shown a cross-sectional side view of a portion of an active region of a power semiconductor device 300 according to another embodiment of the invention. Device 300 is similar to device 200 but has a trench width 232 that is increased as compared to device 200 and as compared to prior art semiconductor devices, such as MOSFET 100. In addition, the trench depth 234 of device 300 may be increased as compared to devices 200 and 100. Specifically, by forming gate electrode 226 of the present invention as a sidewall spacer gate, the width and possibly the depth of the gate trenches 212 may be increased without sacrificing device performance. In particular, as described above for device 100, it is typically desirable to keep the trench width narrow to reduce the size of the gate electrode, thereby reducing the gate charge and the drain epi region to gate electrode overlap (i.e., the gate-drain charge). However, the formation of thin gate trenches may lead to trench defects. Because the spacer gates 226 of the present invention are formed of a thin layer of polysilicon along the gate trench sidewalls, the width 232 of the gate trenches can be increased without increasing the size of the gate electrodes and thereby without increasing the gate charge and gate-drain charge of the device.

In addition, as described above for device 100, it is desirable to have the gate trenches and thereby the gate electrodes extend into the drain epi region to ensure the gate electrodes overlap the channel region. However, it can be difficult to control the trench etch depth to obtain sufficient overlap while not over etching the trenches, thereby resulting in large gate electrodes. The spacer gates 226 of the present invention allow the trench depth 234 to be enlarged to ensure sufficient overlap between channel region 220 and the gates without substantially increasing the size of the gates and sacrificing device performance.

Figure 4:
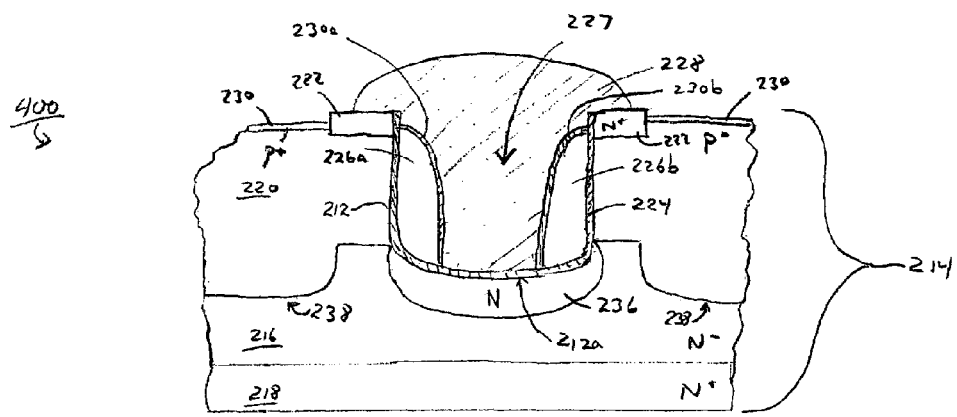
FIG. 4 shows a cross-sectional side view of a portion of a semiconductor device according to another embodiment of the invention, the device of FIG. 4 being similar to the devices of FIGS. 2 and 3 and further including a trench tip implant.

Referring now to FIG. 4, there is shown a cross-sectional side view of a portion of an active region of a power semiconductor device 400 according to another embodiment of the invention. Device 400 is similar to device 200 or device 300 but now further includes trench tip implant 236 formed in drain epi region 216 at the bottom of each gate trench 212, which tip implant is self-aligned to spacer gate 226. Trench tip implant 236 has the same conductivity as drain epi region 216 (e.g., N type), but of higher concentration of impurities. As shown, trench tip implant 236 extends along portion 212a of the bottom surface of trench 212 and along a portion of sidewall spacer gate 226 and serves to control the overlap of the spacer gate with the drain region independent of the depth of the gate trench, thereby allowing the gate trench to be made shallower with respect to the depth of channel region 220. For example, the gate trench may be made the same depth as or shallower than the depth of the channel region. Device 400 also includes a deep body implant 238 formed in channel region 220 along the junction with drain epi region 216. Deep body implant 238 has the same conductivity as channel region 220 (e.g., P type) and extends below the depth of the channel region and possibly below the depth of trenches 212. Overall, deep body implant 238 serves to reduce the intensity of the electric fields at the bottom of the gate trenches and along the junction of the channel and drain epi regions, thereby improving the breakdown voltage of the device.

In a process according to an embodiment of the invention for fabricating device 400 and in particular, for forming trench tip implants 236, the process proceeds as described above for power MOSFET 200 through the dry etching of the doped polysilicon to form spacer gates 226. Next, using the spacer gates as a mask, dopants of the same conductivity as drain epi region 216, for example phosphorous, are implanted in drain epi region 216 along the bottom portion 212a of each gate trench 212. Note that the spacer gates 226 protect channel region 220 from implant contamination during this step. Thereafter, the dopants are diffused to form trench tip implant 236, with this diffusion controlling the gate electrode to drain epi region overlap of the implant. As a result, the trench tip implants are aligned to spacer gate 226. Thereafter, the fabrication process proceeds as above, with the siliciding of the sidewall spacer gates and the formation of gate insulation plug 228.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A power semiconductor device, comprising:
   a semiconductor body of a first conductivity type;
   at least one gate trench along a surface of said semiconductor body, said gate trench having sidewalls and a bottom surface;
   a gate insulation layer lining at least portions of the sidewalls and the bottom surface of said gate trench;
   an insulation body disposed within said gate trench adjacent said bottom surface thereof;
   a gate electrode disposed between respective opposing sides of said insulation body and a respective sidewall of said gate trench, wherein each said gate electrode includes an outer surface facing said insulation body and interior of said gate trench, said outer surface including a top portion that curves downwardly toward the bottom of said gate trench and each said gate electrode including a silicide layer along an outer surface thereof;
   each said silicide layer extending from the bottom surface of said gate trench towards an upper end of said gate trench;
   a channel region of a second conductivity type in said semiconductor body, wherein said gate trench extends through said channel region; and
   a tip implant of said first conductivity type formed within said semiconductor body at the bottom of said gate trench; wherein said tip implant at the bottom of said gate trench is disposed directly below said insulation body within said gate trench and extends below said gate electrodes, wherein said gate insulation layer is disposed between said insulation body and said tip implant at the bottom of said gate trench.

2. The power semiconductor device of claim 1, wherein said insulation body within said gate trench extends from the bottom surface of said gate trench towards an upper end of said gate trench.

3. The power semiconductor device of claim 1, wherein said gate insulation layer within said gate trench has a substantially uniform thickness along the sidewalls and the bottom surface of said gate trench.

4. The power semiconductor device of claim , wherein said gate electrode within said gate trench has a thickness of about 100Å to about 1000Å along the sidewalls of said gate trench.

5. A power semiconductor device, comprising:
   a semiconductor body of a first conductivity type;
   a trench along a surface of said semiconductor body, said trench having sidewalls and a bottom surface;
   a gate insulation layer lining at least portions of the sidewalls and the bottom surface of said trench;
   spacer gate electrodes disposed along at least a portion of the sidewalls of said trench, said spacer gate electrodes within said trench forming a void therein that extends from an upper end of said trench to the bottom surface of said trench; and an insulation body adjacent the bottom surface of said trench and filling said void formed by said spacer gate electrodes within said trench, wherein each said spacer gate electrode includes a silicide layer along an outer surface thereof disposed between said gate electrode and said insulation body;
   a channel region of a second conductivity type in said semiconductor body, wherein said trench extends through said channel region;
   a deep body implant of said second conductivity type formed along a bottom of said channel region and extending to said trench; and
   a tip implant of said first conductivity type formed within said semiconductor body directly below the bottom of said trench, wherein said tip implant extends deeper into said semiconductor body than said deep body implant.

* * * * *

UNITED STATES PATENT AND TRADEMARK OFFICE
CERTIFICATE OF CORRECTION

Page 1 of 1

| | |
|---|---|
| PATENT NO. | : 7,671,441 B2 |
| APPLICATION NO. | : 11/396759 |
| DATED | : March 2, 2010 |
| INVENTOR(S) | : Timothy D. Henson |

It is certified that error appears in the above-identified patent and that said Letters Patent is hereby corrected as shown below:

In the claims, column 8, line 27, --1-- should be inserted immediately before ",".

Signed and Sealed this
First Day of November, 2011

David J. Kappos
*Director of the United States Patent and Trademark Office*